United States Patent

Huang et al.

(10) Patent No.: US 7,427,148 B1
(45) Date of Patent: Sep. 23, 2008

(54) LIGHT MODULES

(75) Inventors: Tien-Fu Huang, Hsinchu County (TW); Chin-Yin Yu, Yilan County (TW); Kuo-Chang Hu, Miaoli County (TW); Shyh-Rong Tzan, Hsinchu County (TW); Shih-Hao Hua, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/747,767

(22) Filed: May 11, 2007

(30) Foreign Application Priority Data

Mar. 15, 2007 (TW) .............................. 96108882 A

(51) Int. Cl.
*F21V 29/00* (2006.01)

(52) U.S. Cl. .................. 362/294; 361/711; 257/712

(58) Field of Classification Search .................. 362/294, 362/373, 600, 611, 612, 631, 800; 174/250–268; 361/704–720
See application file for complete search history.

(56) References Cited

U.S. PATENT DOCUMENTS 5,825,625 A * 10/1998 Esterberg et al. ............ 361/719
6,874,810 B2 * 4/2005 Soderquist ............... 280/728.3
2004/0264195 A1 * 12/2004 Chang et al. ................ 362/294

FOREIGN PATENT DOCUMENTS

| DE | 202005012652 U | 11/2005 |
|---|---|---|
| DE | 102004016847 | 12/2005 |
| DE | 102005056872 | 6/2006 |
| TW | M291085 | 5/2006 |
| TW | M292161 | 6/2006 |

* cited by examiner

*Primary Examiner*—Hargobind S Sawhney
(74) *Attorney, Agent, or Firm*—Quintero Law Office

(57) ABSTRACT

Light modules are provided. A light module includes a circuit board, a lighting element electrically connected to the circuit board, and a first thermal plate. The circuit board has a through hole communicating a first side and a second side thereof. The lighting element is disposed on the first side of the circuit board and located corresponding to the through hole. The first thermal plate is disposed on the second side of the circuit board, opposite to the first side, and comprises a first protrusion extending through the through hole and connecting the lighting element.

6 Claims, 2 Drawing Sheets

LIGHT MODULES

BACKGROUND OF THE INVENTION

1. Field of the Invention

The invention relates in general to light modules and in particular to light modules with high heat dissipation efficiency.

2. Description of the Related Art

With the progress of semiconductor and electronic technologies, traditional Cathode Ray Tube (CRT) displays have increasingly been replaced by flat panel displays having small size and low radiation. Generally, conventional flat panel displays use Cold Cathode Fluorescent Lamps (CCFL) as backlight. However, CCFLs provide only a short lifetime and present difficulties when facilitating miniaturization.

As a result of the aforementioned disadvantages, LEDs have been increasingly applied rather than the conventional CCFL as a light source for the flat panel display. Specifically, since excessive high temperature can adversely reduce illumination and lifetime of LEDs, heat dissipation becomes critical.

BRIEF SUMMARY OF THE INVENTION

Light modules are provided. A light module includes a circuit board, a lighting element electrically connected to the circuit board, and a first thermal plate. The circuit board has a through hole communicating a first side and a second side thereof. The lighting element is disposed on the first side of the circuit board and located corresponding to the through hole. The first thermal plate is disposed on the second side of the circuit board, opposite to the first side, and comprises a first protrusion extending through the through hole and connecting the lighting element.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
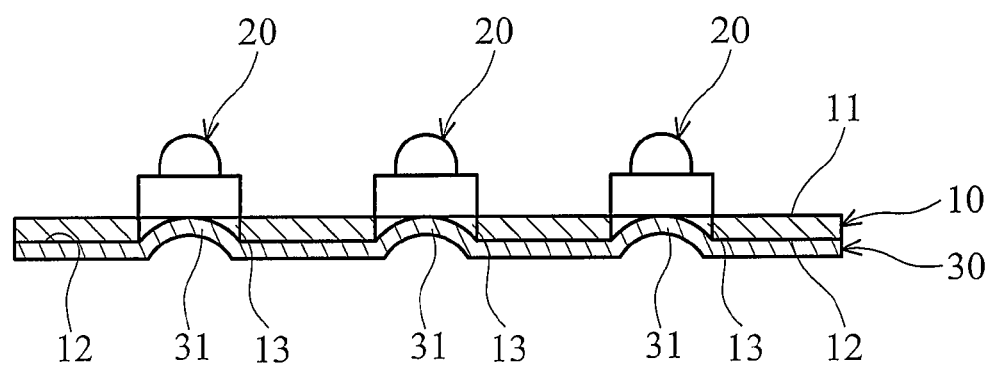
FIG. 1 is a sectional view of a light module.

Referring to FIG. 1, an embodiment of a light module for an electronic device, such as a backlight of a flat panel display, primarily comprises a circuit board 10, a plurality of lighting elements 20 electrically connected to the circuit board 10, and a first thermal plate 30. In this embodiment, the circuit board 10 is a FR-4 printed circuit board, and the lighting elements 20 are LEDs. The first thermal plate 30 has higher thermal conductivity than the circuit board 10, such as an aluminum plate.

As shown in FIG. 1, the lighting elements 20 are disposed on a first side 11 of the circuit board 10, and the first thermal plate 30 is disposed on a second side 12 of the circuit board 10, opposite to the first side 11, to dissipate heat from the lighting elements 20. The circuit board 10 and the first thermal plate 30 can be directly secured by screws or mechanically interlocked with each other. However, the circuit board 10 and the first thermal plate 30 can also be connected to each other by an adhesive thermal pad (not shown) disposed therebetween.

In this embodiment, the circuit board 10 has a plurality of through holes 13 communicating with the first and second sides 11 and 12, and correspondingly, the first thermal plate 30 has a plurality of first protrusions 31 projecting toward the lighting elements 20 via the through holes 13. As shown in FIG. 1, the first protrusions 31 extend through the through holes 13 and physically contact the lighting elements 20, such that heat from the lighting elements 20 is rapidly transferred downward and dissipated via the first thermal plate 30. In some embodiments, the first protrusion 31 and the lighting element 20 can also be thermally connected via an electrically insulating thermal pad (not shown) disposed therebetween.

Figure 2:
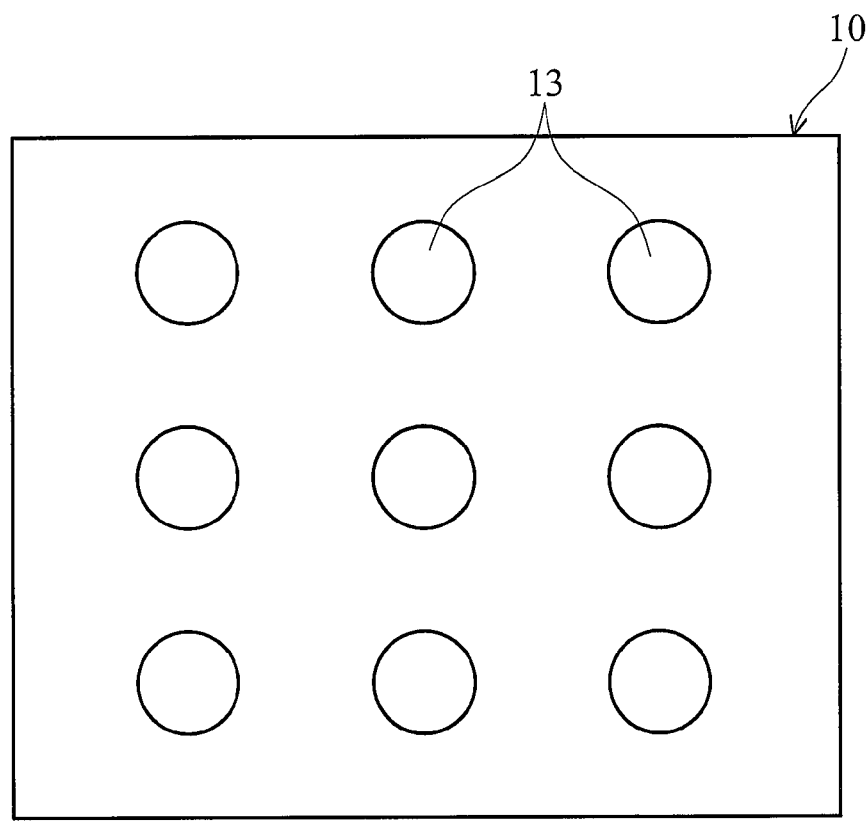
FIG. 2 is a perspective diagram of the circuit board shown in FIG. 1.

Referring to FIG. 2, an embodiment of the lighting elements 20 and the through holes 13 of the first thermal plate 30 are arranged in matrix to provide uniform illumination. However, they can also be arranged in other specific formations to meet illumination distribution requirements.

Figure 3:
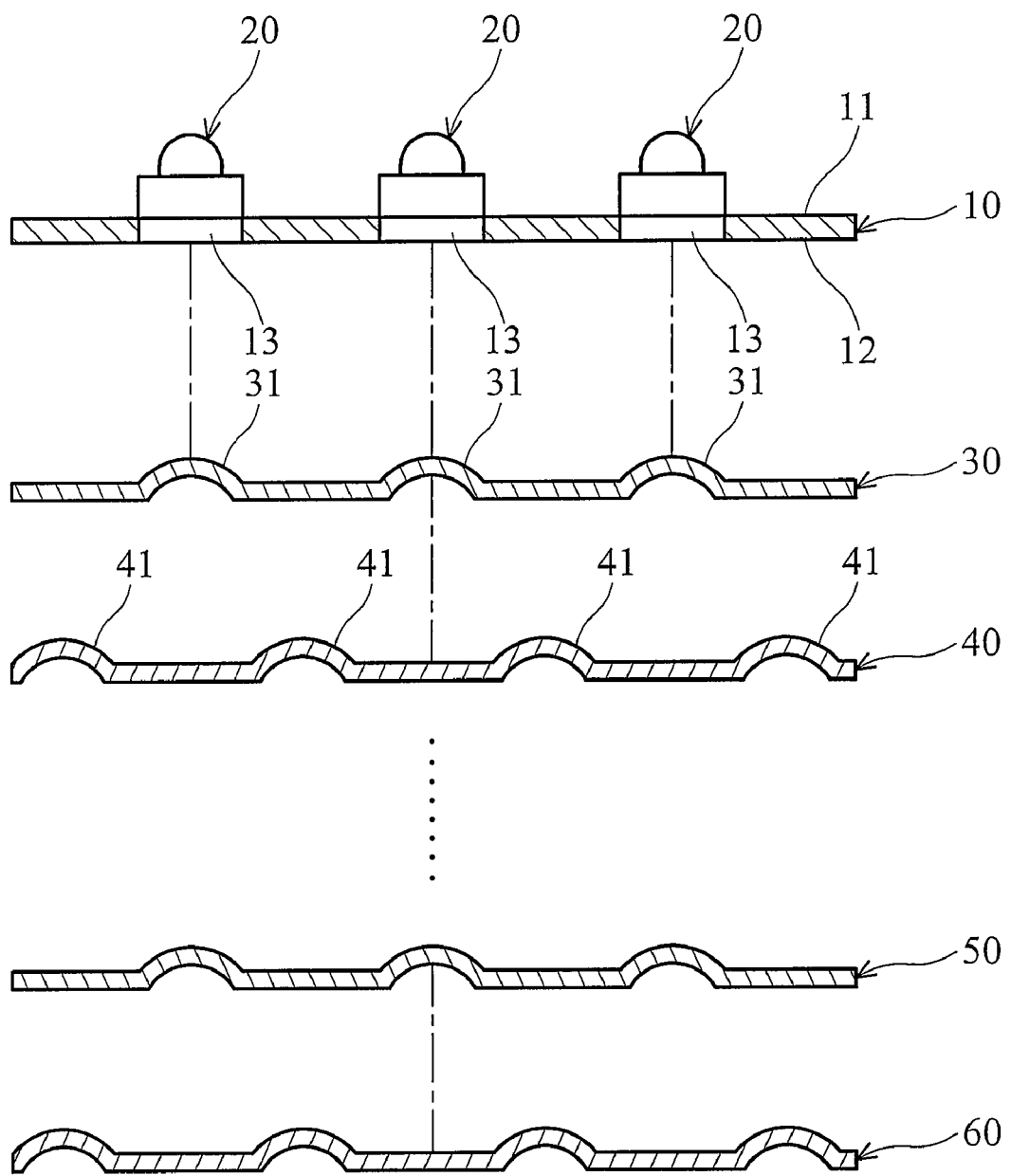
FIG. 3 is a sectional view of another embodiment of a light module.

As shown in FIG. 3, another embodiment of a light module comprises a circuit board 10, a plurality of lighting elements 20 disposed on a first side 11 of the circuit board 10, a first thermal plate 30 disposed on a second side 12 of the circuit board 10, and at least a second thermal plate 40 below the first thermal plate 30. In this embodiment, the first thermal plate 30 has a plurality of first protrusions 31 extending through the through holes 13 of the circuit board 10 and contacting the lighting elements 20. The second thermal plate 40 has a plurality of second protrusions 41 projecting toward the circuit board 10 and connecting the first thermal plate 30. Specifically, locations of the second protrusions 41 are offset with respect to the first protrusions 31, such that the first and second thermal plates 30 and 40 form a space therebetween, increasing heat dissipation area and cooling efficiency thereof. Furthermore, the light module may comprise more thermal plates below the first and second thermal plates 30 and 40, such as the thermal plates 50 and 60 shown in FIG. 3, to enhance cooling efficiency thereof.

Light modules are provided according to the embodiments. A light module comprises a circuit board, a lighting element disposed on a first side of the circuit board, and a thermal plate disposed on a second side of the circuit board, opposite to the first side. The circuit board has at least one through hole with a protrusion of a thermal plate extending therethrough, wherein the protrusion connects the lighting element to dissipate heat via the thermal plate, preventing failure of the lighting element or circuit board due to high temperature.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A light module, comprising:

a circuit board, comprising a first side, a second side opposite to first side, and a through hole communicating with the first and second sides;

a lighting element, electrically connected to the circuit board and disposed on the first side, corresponding to the through hole;

a first thermal plate, disposed on the second side of the circuit board, comprising a first protrusion extending through the through hole and connecting the lighting element; and a second thermal plate connected to the first thermal plate, wherein the second thermal plate comprises a second protrusion projecting toward the circuit board and connecting the first thermal plate, wherein location of the second protrusion is offset with respected to the first extrusion; and the first and second thermal plates form a space therebetween.

2. The light module as claimed in claim 1, wherein the first thermal plate has higher thermal conductivity than the circuit board.

3. The light module as claimed in claim 1, wherein the lighting element comprises an LED.

4. The light module as claimed in claim 1, wherein the circuit board is a FR-4 printed circuit board.

5. The light module as claimed in claim 1, further comprising a plurality of lighting elements, the circuit board further comprising a plurality of through holes corresponding to the lighting elements, the first thermal plate further comprising a plurality of first protrusions respectively extending through the through hole and connecting the lighting elements.

6. The light module as claimed in claim 5, wherein the lighting elements and the through holes are arranged in matrix.

\* \* \* \* \*